United States Patent
Faris

(10) Patent No.: US 7,045,878 B2
(45) Date of Patent: May 16, 2006

(54) SELECTIVELY BONDED THIN FILM LAYER AND SUBSTRATE LAYER FOR PROCESSING OF USEFUL DEVICES

(75) Inventor: Sadeg M. Faris, Pleasantville, NY (US)

(73) Assignee: Reveo, Inc., Elmsford, NY (US)

( * ) Notice: Subject to any disclaimer, the term of this patent is extended or adjusted under 35 U.S.C. 154(b) by 270 days.

(21) Appl. No.: 09/950,909

(22) Filed: Sep. 12, 2001

(65) Prior Publication Data

US 2002/0171080 A1 Nov. 21, 2002

Related U.S. Application Data

(60) Provisional application No. 60/299,284, filed on Jun. 19, 2001, provisional application No. 60/292,237, filed on May 18, 2001, provisional application No. 60/312,659, filed on Aug. 15, 2001, provisional application No. 60/312,516, filed on Aug. 15, 2001.

(51) Int. Cl.
*H01L 29/06* (2006.01)
*H01L 23/58* (2006.01)

(52) U.S. Cl. .................... 257/618; 257/629
(58) Field of Classification Search ............... None
See application file for complete search history.

(56) References Cited

U.S. PATENT DOCUMENTS

| | | | |
|---|---|---|---|
| 4,309,225 A | 1/1982 | Fan et al. ............. 148/1.5 |
| 4,370,176 A | 1/1983 | Bruel ..................... 148/1.5 |
| 4,371,421 A | 2/1983 | Fan et al. ............. 156/624 |
| 4,471,003 A | 9/1984 | Cann ...................... 427/34 |
| 4,479,846 A | 10/1984 | Smith et al. .......... 156/603 |
| 4,500,563 A | 2/1985 | Ellenberger et al. ...... 427/38 |
| 4,585,945 A | 4/1986 | Bruel et al. ........... 250/492.2 |
| 4,816,420 A | 3/1989 | Bozler et al. ............ 437/2 |
| 4,837,182 A | 6/1989 | Bozler et al. ........... 437/82 |
| 4,846,931 A | 7/1989 | Gmitter et al. ......... 156/633 |
| 4,883,561 A | 11/1989 | Gmitter et al. ......... 156/633 |
| 5,273,616 A | 12/1993 | Bozler et al. .......... 156/603 |
| 5,362,682 A | 11/1994 | Bozler et al. .......... 437/226 |
| 5,374,564 A | 12/1994 | Bruel ..................... 437/24 |
| 5,453,153 A | 9/1995 | Fan et al. .............. 117/2 |
| 5,559,043 A | 9/1996 | Bruel .................... 437/424 |
| 5,588,994 A | 12/1996 | Bozler et al. .......... 117/89 |
| 5,676,752 A | 10/1997 | Bozler et al. .......... 117/89 |
| 5,710,057 A | 1/1998 | Kenney ................. 437/62 |
| 5,714,395 A | 2/1998 | Bruel ..................... 437/24 |
| 5,793,115 A | 8/1998 | Zavracky et al. ...... 257/777 |
| 5,845,123 A | 12/1998 | Johnson et al. ........ 395/377 |

(Continued)

FOREIGN PATENT DOCUMENTS

EP 0355913 A1 2/1990

(Continued)

OTHER PUBLICATIONS

Miller, D.L., et. al., "GaAs Peeled Film Solar Cells," Rockwell International, pp. 1-45, Mar. 15, 1980-Dec. 31, 1981.

(Continued)

*Primary Examiner*—Ngân V. Ngô
(74) *Attorney, Agent, or Firm*—Ralph J. Crispino

(57) ABSTRACT

A layered structure generally includes a first layer suitable for having a useful element formed therein or thereon selectively attached or bonded to a second layer. A method to form a layered structure generally comprises selectively adhering a first substrate to a second substrate.

18 Claims, 10 Drawing Sheets

U.S. PATENT DOCUMENTS

| | | | | |
|---|---|---|---|---|
| 5,877,070 | A | 3/1999 | Goesele et al. | 438/458 |
| 5,882,987 | A | 3/1999 | Srikrishnan | 438/458 |
| 5,897,939 | A | 4/1999 | Deleonibus | 428/195 |
| 5,909,627 | A | 6/1999 | Egloff | 438/406 |
| 5,920,764 | A | 7/1999 | Hanson et al. | 438/4 |
| 5,933,750 | A | 8/1999 | Wilson et al. | 438/455 |
| 5,976,953 | A | 11/1999 | Zavracky et al. | 438/455 |
| 5,985,688 | A | 11/1999 | Bruel | 438/53 |
| 5,993,677 | A | 11/1999 | Biasse et al. | 216/36 |
| 5,994,207 | A | 11/1999 | Henley et al. | 438/515 |
| 6,020,252 | A | 2/2000 | Aspar et al. | 438/458 |
| 6,027,988 | A | 2/2000 | Cheung et al. | 483/513 |
| 6,033,974 | A | 3/2000 | Henley et al. | 438/526 |
| 6,054,363 | A | 4/2000 | Sakaguchi et al. | 438/406 |
| 6,054,370 | A | 4/2000 | Doyle | 438/456 |
| 6,059,877 | A | 5/2000 | Bruel | 117/35 |
| 6,071,795 | A | 6/2000 | Cheung et al. | 438/458 |
| 6,103,597 | A | 8/2000 | Aspar et al. | 438/458 |
| 6,137,110 | A | 10/2000 | Pellin et al. | 250/423 |
| 6,146,979 | A | 11/2000 | Henley et al. | 438/458 |
| 6,155,909 | A | 12/2000 | Henley et al. | 451/39 |
| 6,159,323 | A | 12/2000 | Joly et al. | 156/241 |
| 6,159,824 | A | 12/2000 | Henley et al. | 438/455 |
| 6,159,825 | A | 12/2000 | Henley et al. | 438/460 |
| 6,162,705 | A | 12/2000 | Henley et al. | 438/478 |
| 6,184,060 | B1 | 2/2001 | Siniaguine | 438/106 |
| 6,184,111 | B1 | 2/2001 | Henley et al. | 438/514 |
| 6,187,110 | B1 | 2/2001 | Henley et al. | 148/33.2 |
| 6,190,937 | B1 | 2/2001 | Nakagawa et al. | 438/67 |
| 6,190,998 | B1 | 2/2001 | Bruel et al. | 438/407 |
| 6,191,007 | B1 | 2/2001 | Matsui et al. | 438/459 |
| 6,204,151 | B1 | 3/2001 | Malik et al. | 438/460 |
| 6,214,733 | B1 | 4/2001 | Sickmiller | 438/691 |
| 6,221,738 | B1 | 4/2001 | Sakaguchi et al. | 438/455 |
| 6,221,740 | B1 | 4/2001 | Bryan et al. | 438/458 |
| 6,221,774 | B1 | 4/2001 | Malik | 438/690 |
| 6,225,190 | B1 | 5/2001 | Bruel et al. | 438/458 |
| 6,225,192 | B1 | 5/2001 | Aspar et al. | 438/460 |
| 6,232,136 | B1 | 5/2001 | Zavracky et al. | 438/30 |
| 6,309,945 | B1 * | 10/2001 | Sato et al. | 438/409 |
| 6,387,736 | B1 * | 5/2002 | Cao et al. | 438/149 |

FOREIGN PATENT DOCUMENTS

| | | |
|---|---|---|
| EP | 01045448 A1 | 10/2000 |
| JP | 63-155731 * | 6/1988 |
| WO | WO 95/20824 A1 | 8/1995 |
| WO | WO 98/20543 A2 | 5/1998 |
| WO | WO 98/33209 | 7/1998 |
| WO | WO 99/05711 A1 | 2/1999 |
| WO | WO 99/08316 A1 | 2/1999 |
| WO | WO 99/35674 A1 | 7/1999 |
| WO | WO 99/39377 A1 | 8/1999 |
| WO | WO 99/66559 A1 | 12/1999 |
| WO | WO 00/03429 A1 | 1/2000 |
| WO | WO 00/24054 A1 | 4/2000 |
| WO | WO 00/24059 A1 | 4/2000 |
| WO | WO 00/46847 A1 | 8/2000 |
| WO | WO 00/48238 A1 | 8/2000 |
| WO | WO 00/75968 A1 | 12/2000 |
| WO | WO 00/75995 A1 | 12/2000 |
| WO | WO 01/03171 A1 | 1/2001 |
| WO | WO 01/03172 A1 | 1/2001 |

OTHER PUBLICATIONS

Fan, J.C.C., "Thin Films of III-V Compounds and Their Applications," Journal de Physique, 43, pp. C1-327, (1982).

Konagai, Makoto, et al., "High Efficiency GaAs Thin Film Solar Cells by Peeled Film Technology", Journal of Crystal Growth, vol. 45, pp. 277-280, 1978.

Bower, R.W., et al., "Aligned Wafer Bonding: A Key to Three Dimensional Microstructures," Journal of Electronic Materials, vol. 20, No. 5, pp. 383-387, 1991.

Lee, K.Y., et al., "Fabrication of Ultrasmall Devices on Thin Activ GaAs Membranes," J. Vac. Sci. Technol.B5 (1), pp. 322-325, 1987.

Camperi-Ginestet, C., "Alignable Epitaxial Liftoff of GaAs Materials With Selective Deposition Using Polyimide Diaphragms," IEEE Transactions Photonics Technology Letters, pp. 1123-1126, Dec. 12, 1991.

Hargis, M.C., et al., "Epitaxial Lift-Off GaAS/A1GaAs Metal—Semiconductor-Metal Photodetectors with Back Passivaton," IEEE Photonics Technology Letters, vol. 5, No. 10, pp. 1210-1212, 1993.

Schnitzer, L., et al., "Ultra-High Efficiency Light-Emitting-Diode Arrays," IEEE Transactions on Electron Devices, vol. 40, No. 11, pp. 2108-2109, Nov. 1993.

Zhang, L., et. al., "Low-energy Separation By Implantation of Oxygen Structures Via Plasma Source Ion Implantation," Applied Physics Lett., vol. 65, No. 8, pp. 962-964, Aug. 22, 1994.

Bengtsson, S., et al., "Silicon on Aluminum Nitride Structures Formed by Wafer Bonding," Proceedings IEEE International SOI Conference, pp. 35-36, Oct. 1994.

Zahraman, K., et al., "Epitaxial Lift-Off in Photovoltaics: Ultra Thin Al0.2Ga0.8AsCell in a Mechanically Stacked (AL, Ga)As/Si Tandem," First WCPEC, pp. 1898-1901, Dec. 5-9 1994.

Young, Paul G., et al., "RF Control of Epitaxial Lift-Off PHEMT's Under Backside Illumination," IEEE Journal of Quantum Electronics, vol. 30, No. 8, pp. 1782-1786, Aug. 1994.

Hageman, P.R., et al., "Re-use of GAAS Substrates for Epitaxial Lift-Off III-V Solar Cells," IEEE, pp. 1910-1913, 1994.

Wilkinson, Scott T., et al., "Integration of Thin Film Optoelectronic Devices onto Micromachined Movable Platforms," IEEE Photonics Technology Letters, vol. 6, No. 9, 1115-1118, Sep. 1994.

Callahan, J., et al., "Alignable Lift-Off Transfer of Device Arrays Via A Single Polymeric Carrier Membrane," IEEE, pp. 1274-1277, 1995.

Spiering, Vincent L., et al., "Sacrificial Wafer Bonding for Planarization After Very Deep Etching," Journal of Microelectromechanical Systems, vol. 4, No. 3, pp. 151-157, Sep. 1995.

Bhattacharya, D., et al., "Optical Mixing in Epitaxial Lift-Off Pseudomorphic HEMT's," IEEE Photonics Technology Letters, vol. 7, No. 10, pp. 1171-1173, Oct. 1995.

Hohkawa, K., et al., "Fabricatoin of Surface Acoustic Wave Semiconductor Coupled Devices Using Epitaxial Lift-off Technology," IEEE Ultrasonics Symposium, pp. 401-404, 1995.

Fan, J.C., et al., "AlGAAs/GaAs Heterojunction Bipolar Transistors on Si Substrate Using Epitaxial Lift-Off," IEEE Electron Device Letters, vol. 16, No. 9, pp. 393-395, Sep. 1995.

Shah, Divyang M., et al., "Epitaxial Lift-Off GaAs HEMT's," IEEE Transactions on Electron Devices, vol. 42, No. 11, pp. 1877-1881, Nov. 1995.

Morf, T., et al., Integrating Optical Receiver Transplanted by Epitaxial Lift Off, IEEE, pp. 189-192, 1995.

Herrscher, M., "Epitaxial Liftoff In GaAs/InP MSM Photodetectors on Si," Electronics Letters, vol. 31, No. 16, pp. 1383-1384, Aug. 3. 1995.

Omnes, et al., "Substrate Free GaAs Photovoltaic Cells on Pd-Coated Silicon with a 20% AM1.5 Efficiency," IEEE Transactions on Electron Devices, vol. 43, No. 11, pp. 1806-1811 (Nov. 1996).

Jokerst. N.M., et al., "Thin-Film Multimaterial Optoelectronic Integrated Circuits," IEEE Transactions on Components, Packaging, and Manufacturing Technology—Part B, vol. 19, No. 1, pp. 97-105, Feb. 1996.

Tong, Q.Y., et al., "Feasiblity Study of VLSI Device Layer Transfer by CMP PETEOS Direct Bonding," Proceedings 1996 IEEE International SOI Conference, pp. 36-37, Oct. 1996.

Dohle, G. Rainer, et al., "A New Bonding Technique for Microwave Devices," IEEE Transactions on Components, Packaging, and Manufacturing Technology—Part B, vol. 19, No. 1, pp. 57-63, Feb. 1996.

Yazawa, Y., et al., "Three-Junction Solar Cells Comprised of a Thin-Film GainP/GaAs Tandem Cell Mechanically Stacked on a Si Cell," IEEE, pp. 899-902, Sep. 30-Oct. 3, 1997.

Yablonovitch, E., et al., "Extreme Selectivity in the Lift-Off of Epitaxial GaAs Films", Appl. Phys. Lett., 51 (26), pp. 2222-2224, Dec. 28, 1997.

Chun, Carl, et al., "Integrated 1.55 um Receivers Using GaAs MMICS and Thin Film InP Detectors," IEEE, pp. 47-50, 1998.

Yun, C.H., et al., "Transfer of Patterned Ion-Cut Silicon Layers," Applied Physics Lett., vol. 73, No. 19, pp. 2772-2774, Nov. 9, 1998.

Geppert, Linda, "Solid State," IEEE Spectrum, pp. 52-56, Jan. 1999.

Pasquareillo, D. et al., "Mesa-Spacers: Enabling Non-Destructive Measurements of Surface Energy in Room Temperature Wafer Bonding," as published in *Semiconductor Wafer Bonding: Science, Technology and Applications*, Electrochemical Society Proceedings, vol. 99-35, pp. 110-118, Fall 1999.

Bagdahn, J. et al., "Lifetime Properties of Wafer-Bonded Components Under Static and Cyclic Loading ," as published in *Semiconductor Wafer Bonding: Science, Technology, and Applications*,. Electrochemical Society Proceeding, vol. 99-35, pp. 129-135, Fall 1999.

Beggans, M., et al., "Oxidation Effect on Microcontamination and Bondability of Ultrathin Silicon Wafers," as published in *Semiconductor Wafer Bonding: Science, Technology, and Applications*, Electrochemical Society Proceeding, vol. 99-35, pp. 137-145, Fall 1999.

Pasquariello, D., et al., "Oxidation and Induced Damages in Oxygen Plasma In-Situ Wafer Bonding," as published in *Semiconductor Wafer Bonding: Science, Technology, and Applications*, Electrochemical Society Proceedings, vol. 99-35, pp. 169-177, Fall 1999.

Bagdahn, J. et al., Measurement of the Local Strength Distribution of Directly Bonded Silicon Wafers Using the Micro-Chevron-Test, as published in *Semiconductor Wafer Bonding: Science, Technology, and Applications*, Electrochemical Society Proceedings, vol. 99-35, pp. 218-231, Fall 1999.

Andreas, P. et al., "Room Temperature Covalent Bonding: Effect on Interfacial Properties," as published in Semiconductor Wafer Bonding: Science, Technology, and Applications, Electrochemical Society Proceedings, vol. 99-35, pp. 232-243, Fall 1999.

Kopper-Schmidt, P., et al., "Recent Developments in Adhesion-Enhanced High-Vacuum Bonding By In Situ Plasma Surface Precleaning," as published in *Semiconductor Wafer Bonding: Science, Technology, and Applications*, Electrochmeical Society Proceedings, vol. 99-35, pp. 259-273, Fall 1999.

Krauter, G. et al., "Interface Chemistry of Tailor-Made Monolayers for Low-Temperature Wafer Bonding," as published in *Semiconductor Wafer Bonding: Science, Technology, and Applications*, Electrochemical Society Proceedings, vol. 99-35, pp. 275-281, Fall 1999.

Wiegand, M. et al., "Effect of O2 Plasma Pretreatment on the Bonding Behavior of Silicon (100) Wafers," as published in *Semiconductor Wafer Bonding: Science, Technology, and Applications*, Electrochemical Society Proceedings, vol. 99-35, pp. 282-291, Fall 1999.

Reiche, M. et al., "Plasma Activation for Low-Temperature Wafer Direct Bonding," as published in *Semiconductor Wafer Bonding: Science, Technology, and Applications*, Electrochemical Society Proceeding, vol. 99-35, pp. 292-325, Fall 1999.

Tong, Q.T., "Wafer Bonding and Layer Transfer for Microsystems: An Overview," as published in *Semiconductor Wafer Bonding: Science, Technology, and Applications*, Electrochemical Society Proceedings, vol. 99-35, pp. 1-39, Fall 1999.

Reiche, M. et al., "Bonding Behaviour of Different Interfacial Layers," as published in *Semiconductor Wafer Bonding: Science, Technology, and Applications*, Electrochemical Society Proceedings, vol. 99-35, pp. 100-105.

Labossiere, et al., "Characterization of Wafer Bond Toughness," as published in *Semiconductor Wafer Bonding: Science, Technology, and Applications, Electrochemical Society Proceedings*, vol. 99-35, pp. 338-349, Fall 1999.

Syms, R.R.A. et al., "3-D Self Assembly of Opto-Mechanical Structures Using Bonded Silicon-on-Insulator," as published in *Semiconductor Wafer Bonding: Science, Technology, and Applications*, Electrochemical Society Proceedings, vol. 99-35, pp. 110-118, Fall 1999.

Chu, Paul K. et al., "Microcavities Formed by Hydrogen or Helium Plasma Immersion Ion Implntation," IEEE, pp. 1238-1241.

King, Tsu-Jae, "Poly-Si TFTs for Plastic Substrates," Information Display, pp. 24-26, Apr. 2001.

Williams, David, et al., "Microsystems Mature," Spie's Magazine, pp. 27-29, May 2001.

Marcinkevicius, Andrius et al., "Femtosecond Laser-Assisted Three-Dimensional Microfabrication in Silica," Optics Letters, vol. 26, No. 5, pp. 277-279, Mar. 1, 2001.

Jokerst, N.M., "Epitaxial Liftoff of GaAs Detectors Onto Silicon Integrated Circuits," pp. 664-665.

Tong, Q-Y., et al., "Wafer Bonding of Si With Dissimilar Materials," pp. 524-526.

Basco, Ricardo, et al., "Monolithic Integration of a 94GHz AlGAAs/GaAs 2 DEG Mixer on Quartz Substrate by Epitaxial Lift-Off," Department of Electrical and Computer Engineering University of Massachusetts, Amherst MA, pp. 38-39 (*that is the only info.*).

Akatsu T., et al., "Wafer Bonding of Compoun Semiconductors Using Atomic Hydrogen," Electrochemical Society Proceedings, vol. 99-35, pp. 60-419.

Schaffer, Chris B., et al., "Micromachining Using Ultrashort Pulses From a Laser Oscillator,".

Huang, L-J., et al., "Critical Bonding Energy Required for Hydrogen-Implantation Induced Layer Splitting,"Electrochemical Society Proceedings, vol. 99-35, pp. 68-77,.

Klem, J.F., et al., "Characteristics of Lift-Off Fabricated AlGaAs/InGaAs Single-Strained-Quantum-Well Structures on Glass and Silicon Substrates,".

International Search Report Dated Jun. 10, 2003 for PCT/US0215864.

"Selective Wafer Bonding by Surface Roughness Control" by C. Gui, et al. published in Journal of the Electrochemical Society, 148 (4) G225-G228 2001 pp. G225-G228.

* cited by examiner

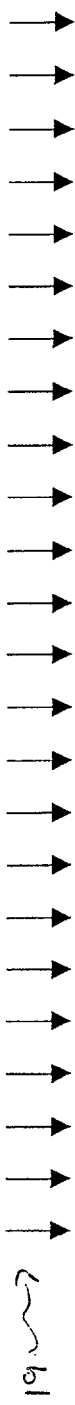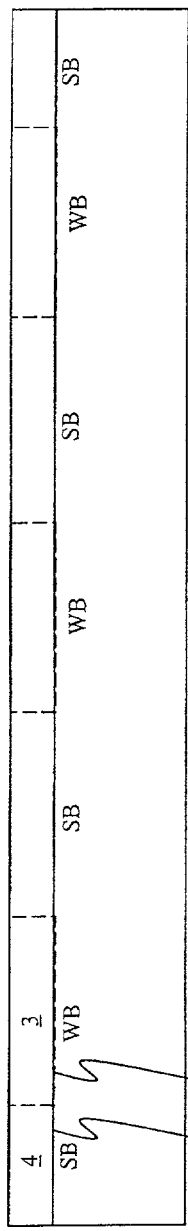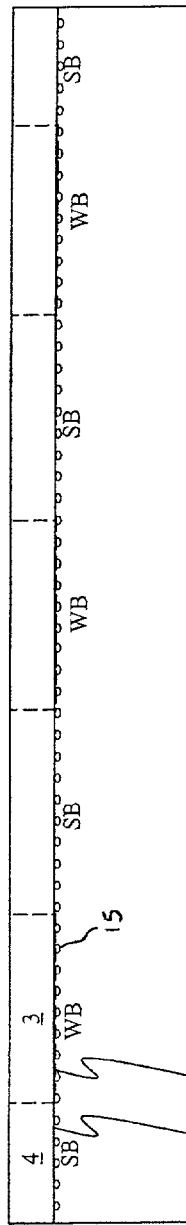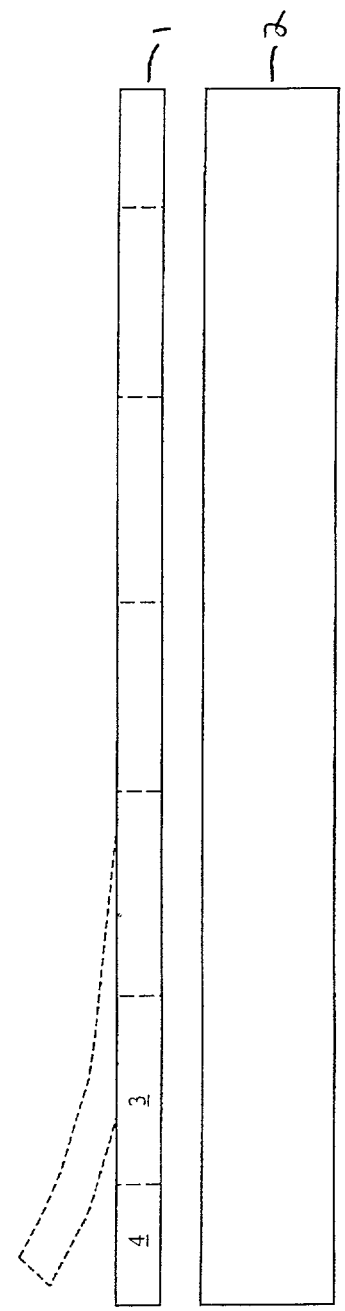
Figure 27
Figure 28
Figure 29

SELECTIVELY BONDED THIN FILM LAYER AND SUBSTRATE LAYER FOR PROCESSING OF USEFUL DEVICES

This application claims benefit of application Ser. No. 60/299,284 filed Jun. 19, 2001 and application Ser. No. 60/292,237 filed May 18, 2001 and application Ser. No. 60/312,659 filed Aug. 15, 2001 and application Ser. No. 60/312,516 filed Aug. 15, 2001.

BACKGROUND OF THE INVENTION

1. Field of the Invention

The present invention relates to thin films and production methods thereof, and more particularly to thin films (e.g., semiconductors) capable having one or more structures (e.g., microelectronics) formed thereon or therein.

2. Description of the Prior Art

Thin film materials such as semiconductors are the backbone of many of today's miniaturized products. These everyday devices are, for example, based on integrated circuits, photovoltaics, or the like. Improvements in these products are constantly being sought, typically to enhance performance and reliability, as well as to reduce material and labor costs associated with manufacture thereof.

A primary objective in processing of many semiconductors and other thin film devices is to form thin films with very small dimensions (e.g., on the order of microns). Thin devices may be useful for structural objectives, such as smaller and more lightweight products, and performance objectives, such as speed and reliability. For example, portable electronics, solar cells, DRAMs, and many other systems benefit from thinner semiconductor devices. Further, many devices employ a plurality of stacked semiconductor devices, forming a three dimensional circuit, for example. One such three dimensional system is described in U.S. Pat. Nos. 5,786,629 entitled "3-D Packaging Using Massive Fillo-Leaf Technology" by Sadeg. M. Faris and incorporated herein by reference.

Accordingly, improvements in the thin films themselves are required. Indeed many attempts have been made to improve processing and reliability of thin film based devices, while reducing the thickness thereof. It is well recognized that it is desirable to separate the substrate layer and the thin film device layer. Further, since most materials used to form thin film substrates (e.g., semiconductors) are relatively expensive, minimization of wasted material is desirable. However, many conventional thin film substrates processing methods waste material, as described below.

Certain devices, such as photovoltaics, require use of the thin films alone (i.e., without a substrate). In other conventional arrangements, a thin film semiconductor substrate having microelectronics or other useful structures thereon are supported on a substrate (e.g., Si). The thin film substrate may be grown, for example, using epitaxial growth techniques. However, formation of a uniform film is difficult with this technique. Further, layer growth is extremely cumbersome when the substrate materials are different. Therefore, it is very desirable to transfer a thin semiconductor device layer to a foreign substrate.

Conventional manufacturing processes for forming thin film devices include forming a circuit or other useful element (e.g., electronic, optical, and photovoltaic) on a substrate. During processing, the substrate is required to provide mechanical support and thermal stability. The processed substrate, therefore, must be sufficiently thick to withstand the harsh processing environment, including high pressures and temperatures, as well as chemical and energy exposure. Further processing is therefore required if viable thin film devices are sought.

One processing approach, undertaken after a circuit or other structure is formed on a sufficiently thick substrate to withstand processing, is to remove the thickness of the substrate by mechanical methods. These mechanical methods, such as cutting or grinding, waste a tremendous amount of material and labor. The cut or ground material often may not be recycled, or, even if it is recyclable, the material must undergo further processing before reuse. Further, the thinned substrate is generally subjected to polishing or other processes to smooth the surface. Other techniques include formation of an etch stop layer on the substrate prior to device fabrication. However, the substrate is still typically ground or otherwise mechanically removed prior to a selective etching step, which etches the substrate generally to the etch stop layer. All of these techniques result in wasted time and material, as well presenting quality control concerns.

Another technique to form thin film devices utilizes ion implantation methods. A common use of ion implantation is to generally derive thin layers of semiconductor materials. Such methods are disclosed in, for example, EP01045448 and WO00/024059, both entitled "Method of Producing SOI Wafer by Hydrogen Ion Implanting Separation Method and SOI Wafer Produced by the Method," and both incorporated by reference herein. Particularly, ions, such as hydrogen ions or helium ions, are implanted within the top surface of an oxidized silicon wafer. The ions are implanted to a depth within the top surface. Thereafter, a thin layer may be delaminated from the bulk silicon substrate, which is generally subjected to high temperature (greater than about 500° C.) processes. This thin layer may be then supported on an insulator layer and a substrate, and microelectronics or other structures may be formed thereon. The microelectronics, however, must be formed subsequent to delaminating the thin layer, since ion implantation detrimentally affects the microelectronics. Particularly, the thin layer may be warped, the devices may be damaged by the ion implantation, or the device may be damaged during delamination.

Bruel et al. WO 98/33209, entitled "Method For Obtaining A Thin Film, In Particular Semiconductor, Comprising A Protected Ion Zone And Involving An Ion Implantation", discloses an approach to providing a thin film including a metal oxide semiconductor (MOS). In general, a MOS transistor is formed on the surface of a semiconductor substrate. The region of the transistor is masked, and surrounding regions are ion implanted to define an intended line of fracture (i.e., where microbubbles develop from the ion implantation step). To separate the thin film having the transistor thereon, cleavage is commencing at the intended line of fracture in the vicinity of the microbubbles, and is propagated through the crystal plane under the transistor (i.e., where no microbubbles exist). While it may be possible to realize thin films having transistors thereon using the teachings of WO 98/33209, the transistors are subjected to undesirable stress in the cleavage propagation, since the crystalline structure of the substrate material must be fractured in the immediate vicinity of the transistor.

Aspar et al. U.S. Pat. No. 6,103,597 entitled "Method Of Obtaining A Thin Film Of Semiconductor Material" generally teaches subjecting a thin film substrate having microelectronics or other structures therein to ion bombardment. Gaseous microbubbles are thus formed at a depth therein defining the thickness of the thin film. However, many types of microelectronics and structures that may be formed on the substrate require a subsequent annealing step, in order to repair damage or other defects imparted to the elements. Thereafter, the thin film layer is taught to be separable from the underlying substrate material by thermal treatment that causes a fracture along the line of the microbubbles.

Sakaguchi et al., U.S. Pat. Nos. 6,221,738 entitled "Substrate And Production Method Thereof" and U.S. Pat. No. 6,100,166 entitled "Process For Producing Semiconductor Article", both of which are incorporated by reference herein, teach bonding a substrate to a porous semiconductor layer. The bonding at the porous layer is taught to be mechanically weaker, thus facilitating removal by application of an external force. U.S. Pat. No. 6,100,166 teaches that a layer may be removed with a force in a peeling direction. However, both of these references disclose use of the weak porous separation mechanism at the entire interface between the layers. This may compromise overall mechanical integrity of the intermediate structure and any semiconductor devices formed on the porous semiconductor material.

Henley et al., U.S. Pat. No. 6,184,111 entitled "Pre-Semiconductor Process Implant And Post-Process Film Separation," which is incorporated by reference herein, discloses use of a stressed layer at a selected depth below a silicon wafer surface. Devices are formed above the stressed layer. Implantation is generally carried out at the same energy level with varying dosage across the diameter of the wafer. Controlled cleavage propagation is initiated to separate a layer above the stressed layer, including any devices thereon. It is noted that processing to form the stressed layer may damage devices formed thereon, thus subsequent repair annealing is typically required. Therefore, conventional ion implantation and delamination methods are lacking in that a thin film including microelectronics or other structures thereon may not be ion implanted without warping or other damage to the thin semiconductor.

Therefore, considering the deficiencies of present thin film processing, it would be desirable to provide a multiple layered substrate, wherein a device layer is provided on a support layer in a condition to allow processing of microelectronics or other structures, such that the device layer with the structures formed therein or thereon is readily removable from the support layer.

It would further be desirable to provide a method of manufacturing a thin layer having microelectronics or other structures by processing the structures on a device layer, wherein the device layer is disposed a support layer, such that the device layer may be removed by peeling or other convenient methods.

Additionally, it would be desirable to provide a user a multiple layered substrate having device regions on a device layer, such that the user may process microelectronics or other structures therein or thereon, and substantially remove the device layer by peeling or other convenient methods.

OBJECTS OF THE INVENTION

Accordingly, a primary object of the present invention is to provide a low cost, flexible thin film device, such as a semiconductor device.

Another object of the present invention is to provide a multiple layered substrate, wherein a device layer is provided on a support layer in a condition to allow processing of microelectronics or other structures in a pattern that may be selected by a user.

It is another object of the invention is to provide a multiple layered substrate, wherein a device layer is provided on a support layer in a condition to allow processing of microelectronics or other structures in various patterns, such that the device layer with the structures formed therein or thereon is readily removable from the support layer without damaging, or minimally damaging, the structures formed on the device layer.

Additionally, an object of the invention is to provide a multiple layered substrate, wherein a device layer is provided on a support layer in a condition to allow processing of microelectronics or other structures in various patterns, such that the device layer with the structures formed therein or thereon may be peeled from the support layer; without damaging, or minimally damaging, the structures formed on the device layer.

A further object of the invention is to provide a multiple layered substrate, wherein a device layer is provided on a support layer in a condition to allow processing of microelectronics or other structures, such that the device layer with the structures formed therein or thereon may be peeled or otherwise readily removed from the support layer, wherein the support layer may be reused as: a support layer in a subsequent operation, as a device layer, or as a source of material to derive another device layer.

An additional object of the invention is to provide a multiple layered substrate, wherein a device layer is provided on a support layer in a condition to allow processing of microelectronics or other structures under harsh chemical and/or physical (i.e., temperature and/or pressure) conditions of processing such as semiconductor device processing.

It is another object of the invention to provide a method of manufacturing a thin film having microelectronics or other structures by processing the structures on a device layer, wherein the device layer is disposed a support layer, such that the device layer may be removed by peeling or other convenient methods.

Additionally, an object of the invention is to provide a user a multiple layered substrate having device regions on a device layer, such that the user may process any useful structure or device in or upon the device layer, and further such that the thin device layer may be readily removed including the useful structures formed therein or thereon.

SUMMARY OF THE INVENTION

The above-discussed and other problems and deficiencies of the prior art are overcome or alleviated, and the objects of the invention are attained, by the several methods and apparatus of the present invention. A multiple layer substrate generally includes a first layer suitable for having a structure formed therein or thereon selectively attached or bonded to a second layer. A method to form a multiple layered substrate generally comprises selectively adhering a first substrate to a second substrate.

In one embodiment, a multiple layer substrate includes a first layer selectively attached or bonded to a second layer. The selective bonding generally includes one or more regions of strong bonding and one or more regions of weak bonding. Structures may be formed in or upon the one or more regions of weak bonding, for example by an end user that is supplied the multiple layer substrate. Thus, the user may form the structures, which oftentimes must be accomplished under harsh operating conditions, while maintaining the integrity of the first substrate layer. Since the second layer is utilized to provide support and thermal stability, the first layer may be very thin (e.g., less than one micron if desired). Subsequently, the first layer may be readily removed from the second layer by, for example, peeling or other convenient methods. Since the structures are formed within or upon weak bond regions of the first layer, they are minimally affected, and preferably not affected at all, during removal, such that little or no subsequent structure repair or processing is required.

The above-discussed and other features and advantages of the present invention will be appreciated and understood by those skilled in the art from the following detailed description and drawings.

BRIEF DESCRIPTION OF THE DRAWINGS

FIGS. 21–32 depict various debonding techniques.

DETAILED DESCRIPTION OF THE ILLUSTRATIVE EMBODIMENTS

Figure 1:
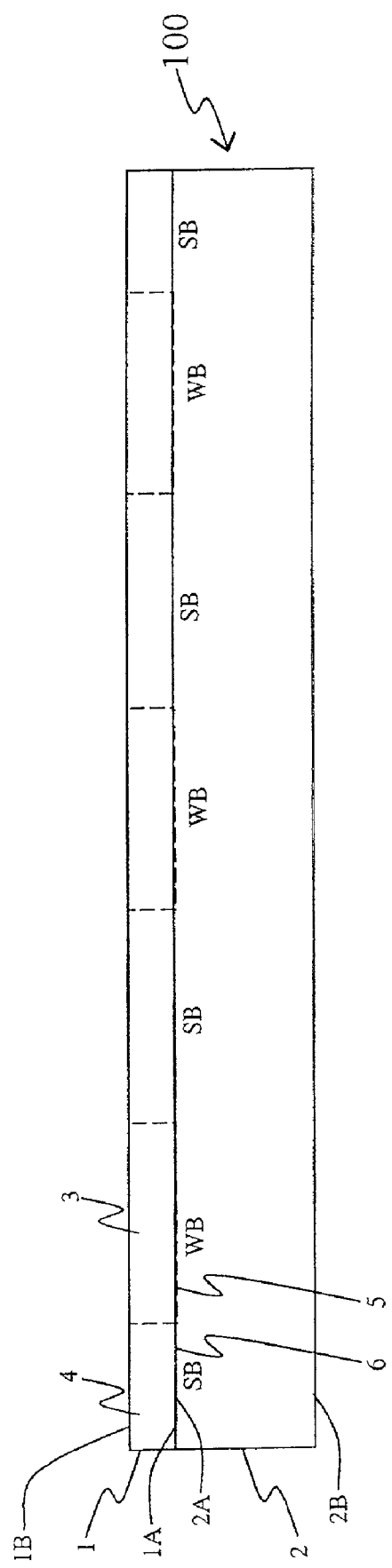
FIG. 1 is a schematic representation of an embodiment of a layered structure described herein.

Referring to FIG. 1, a selectively bonded multiple layer substrate 100 is shown. The multiple layer substrate 100 includes a layer 1 having an exposed surface 1B, and a surface 1A selectively bonded to a surface 2A of a layer 2. Layer 2 further includes an opposing surface 2B. In general, to form the selectively bonded multiple layer substrate 100, layer 1, layer 2, or both layers 1 and 2 are treated to define regions of weak bonding 5 and strong bonding 6, and subsequently bonded, wherein the regions of weak bonding 5 are in a condition to allow processing of a useful device or structure.

In general, layers 1 and 2 are compatible. That is, the layers 1 and 2 constitute compatible thermal, mechanical, and/or crystalline properties. In certain preferred embodiments, layers 1 and 2 are the same materials. Of course, different materials may be employed, but preferably selected for compatibility.

One or more regions of layer 1 are defined to serve as the substrate region within or upon which one or more structures, such as microelectronics may be formed. These regions may be of any desired pattern, as described further herein. The selected regions of layer 1 may then be treated to minimize bonding, forming the weak bond regions 5. Alternatively, corresponding regions of layer 2 may be treated (in conjunction with treatment of layer 1, or instead of treatment to layer 1) to minimize bonding. Further alternatives include treating layer 1 and/or layer 2 in regions other than those selected to form the structures, so as to enhance the bond strength at the strong bond regions 6.

After treatment of layer 1 and/or layer 2, the layers may be aligned and bonded. The bonding may be by any suitable method, as described further herein. Additionally, the alignment may be mechanical, optical, or a combination thereof. It should be understood that the alignment at this stage may not, be critical, insomuch as there are generally no structures formed on layer 1. However, if both layers 1 and 2 are treated, alignment may be required to minimized variation from the selected substrate regions.

The multiple layer substrate 100 may be provided to a user for processing of any desired structure in or upon layer 1. Accordingly, the multiple layer substrate 100 is formed such that the user may process any structure or device using conventional fabrication techniques, or other techniques that become known as the various related technologies develop. Certain fabrication techniques subject the substrate to extreme conditions, such as high temperatures, pressures, harsh chemicals, or a combination thereof. Thus, the multiple layer substrate 100 is preferably formed so as to withstand these conditions.

Useful structures or devices may be formed in or upon regions 3, which partially or substantially overlap weak bond regions 5. Accordingly, regions 4, which partially or substantially overlap strong bond regions 6, generally do not have structures therein or thereon. After a user has formed useful devices within or upon layer 1 of the multiple layer substrate 100, layer 1 may subsequently be debonded. The debonding may be by any known technique, such as peeling, without the need to directly subject the useful devices to detrimental delamination techniques. Since useful devices are not generally formed in or on regions 4, these regions may be subjected to debonding processing, such as ion implantation, without detriment to the structures formed in or on regions 3.

To form weak bond regions 5, surfaces 1A, 2A, or both may be treated at the locale of weak bond regions 5 to form substantially no bonding or weak bonding. Alternatively, the weak bond regions 5 may be left untreated, whereby the strong bond region 6 is treated to induce strong bonding. Region 4 partially or substantially overlaps strong bond region 6. To form strong bond region 4, surfaces 1A, 2A, or both may be treated at the locale of strong bond region 6. Alternatively, the strong bond region 6 may be left untreated, whereby the weak bond region 5 is treated to induce weak bonding. Further, both regions 5 and 6 may be treated by different treatment techniques, wherein the treatments may differ qualitatively or quantitatively.

After treatment of one or both of the groups of weak bond regions 5 and strong bond regions 6, layers 1 and 2 are bonded together to form a substantially integral multiple layer substrate 100. Thus, as formed, multiple layer substrate 100 may be subjected to harsh environments by an end user, e.g., to form structures or devices therein or thereon, particularly in or on regions 3 of layer 1.

The phrase "weak bonding" or "weak bond" generally refers to a bond between layers or portions of layers that may be readily overcome, for example by debonding techniques such as peeling, other mechanical separation, heat, light, pressure, or combinations comprising at least one of the foregoing debonding techniques. These debonding techniques minimally defect or detriment the layers 1 and 2, particularly in the vicinity of weak bond regions 5.

The treatment of one or both of the groups of weak bond regions 5 and strong bond regions 6 may be effectuated by a variety of methods. The important aspect of the treatment is that weak bond regions 5 are more readily debonded (in a subsequent debonding step as described further herein) than the strong bond regions 6. This minimizes or prevents damage to the regions 3, which may include useful structures thereon, during debonding. Further, the inclusion of strong bond regions 6 enhances mechanical integrity of the multiple layer substrate 100 especially during structure processing. Accordingly, subsequent processing of the layer 1, when removed with useful structures therein or thereon, is minimized or eliminated.

The ratio of the bond strengths of the strong bond regions to the weak bond regions (SB/WB) in general is greater than 1. Depending on the particular configuration of the strong bond regions and the weak bond regions, and the relative areas of the strong bond regions and the weak bond regions, the value of SB/WB may approach infinity. That is, if the strong bond areas are sufficient in size and strength to maintain mechanical and thermal stability during processing, the bond strength of the weak bond areas may approach zero. However, the ratio SB/WB may vary considerably, since strong bonds strengths (in typical silicon and silicon derivative, e.g., $SiO_2$, wafers) may vary from about 500 millijoules per squared meter ($mj/m^2$) to over 5000 $mj/m^2$ as is taught in the art (see, e.g., Q. Y. Tong, U. Goesle, Semiconductor Wafer Bonding, Science and Technology, pp. 104–118, John Wiley and Sons, New York, N.Y. 1999, which is incorporated herein by reference). However, the weak bond strengths may vary even more considerably, depending on the materials, the intended useful structure (if known), the bonding and debonding techniques selected, the area of strong bonding compared to the area of weak bonding, the strong bond and weak bond configuration or pattern on the wafer, and the like. For example, where ion implantation is used as a step to debond the layers, a useful weak bond area bond strength may be comparable to the bond strength of the strong bond areas after ion implantation and/or related evolution of microbubbles at the implanted regions. Accordingly, the ratio of bond strengths SB/WB is generally greater than 1, and preferably greater than 2, 5, 10, or higher, depending on the selected debonding techniques and possibly the choice of the useful structures or devices to be formed in the weak bond regions.

The particular type of treatment of one or both of the groups of weak bond regions 5 and strong bond regions 6 undertaken generally depends on the materials selected. Further, the selection of the bonding technique of layers 1 and 2 may depend, at least in part, on the selected treatment methodology. Additionally, subsequent debonding may depend on factors such as the treatment technique, the bonding method, the materials, the type or existence of useful structures, or a combination comprising at least one of the foregoing factors. In certain embodiments, the selected combination of treatment, bonding, and subsequent debonding (i.e., which may be undertaken by an end user that forms useful structures in regions 3 or alternatively, as an intermediate component in a higher level device) obviates the need for cleavage propagation to debond layer 1 from layer 2 or mechanical thinning to remove layer 2, and preferably obviates both cleavage propagation and mechanical thinning. Accordingly, the underlying substrate may be reused with minimal or no processing, since cleavage propagation or mechanical thinning damages layer 2 according to conventional teachings, rendering it essentially useless without further substantial processing.

One treatment technique may rely on variation in surface roughness between the weak bond regions 5 and strong bond regions 6. The surface roughness may be modified at surface 1A (FIG. 4), surface 2A (FIG. 5), or both surfaces 1A and 2A. In general, the weak bond regions 5 have higher surface roughness 7 (FIGS. 4 and 5) than the strong bond regions 6. In semiconductor materials, for example the weak bond regions 5 may have a surface roughness greater than about 0.5 nanometer (nm), and the strong bond regions 4 may have a lower surface roughness, generally less than about 0.5 nm. In another example, the weak bond regions 5 may have a surface roughness greater than about 1 nm, and the strong bond regions 4 may have a lower surface roughness, generally less than about 1 nm. In a further example, the weak bond regions 5 may have a surface roughness greater than about 5 nm, and the strong bond regions 4 may have a lower surface roughness, generally less than about 5 nm. Surface roughness can be modified by etching (e.g., in KOH or HF solutions) or deposition processes (e.g., low pressure chemical vapor deposition (LPCVD) or plasma enhanced chemical vapor deposition (PECVD)). The bonding strength associated with surface roughness is more fully described in, for example, Gui et al., "Selective Wafer Bonding by Surface Roughness Control", *Journal of The Electrochemical Society*, 148 (4) G225–G228 (2001), which is incorporated by reference herein.

Figure 4:
Figure 5:
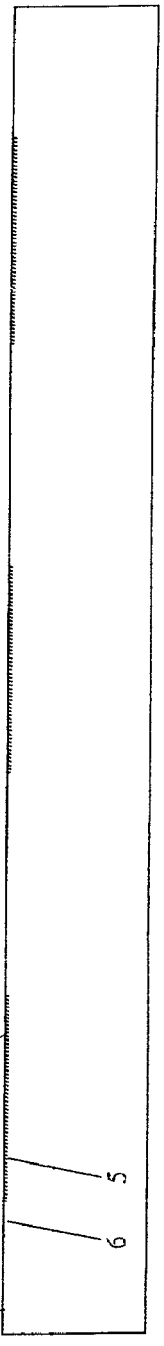

In a similar manner (wherein similarly situated regions are referenced with similar reference numbers as in FIGS. 4 and 5), a porous region 7 may be formed at the weak bond regions 5, and the strong bond regions 6 may remain untreated. Thus, layer 1 minimally bonds to layer 2 at locale of the weak bond regions 5 due to the porous nature thereof. The porosity may be modified at surface 1A (FIG. 4), surface 2A (FIG. 5), or both surfaces 1A and 2A. In general, the weak bond regions 5 have higher porosities at the porous regions 7 (FIGS. 4 and 5) than the strong bond regions 6.

Another treatment technique may rely on selective etching of the weak bond regions 5 (at surfaces 1A (FIG. 4), 2A (FIG. 5), or both 1A and 2A), followed by deposition of a photoresist or other carbon containing material (e.g., including a polymeric based decomposable material) in the etched regions. Again, similarly situated regions are referenced with similar reference numbers as in FIGS. 4 and 5. Upon bonding of layers 1 and 2, which is preferably at a temperature sufficient to decompose the carrier material, the weak bond regions 5 include a porous carbon material therein, thus the bond between layers 1 and 2 at the weak bond regions 5 is very weak as compared to the bond between layers 1 and 2 at the strong bond region 6. One skilled in the art will recognize that depending on the circumstances, a decomposing material will be selected that will not out-gas, foul, or otherwise contaminate the substrate layers 1 or 2, or any useful structure to be formed in or upon regions 3.

Figure 10:
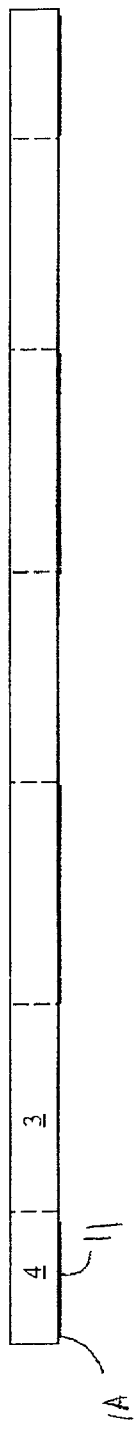
Figure 11:
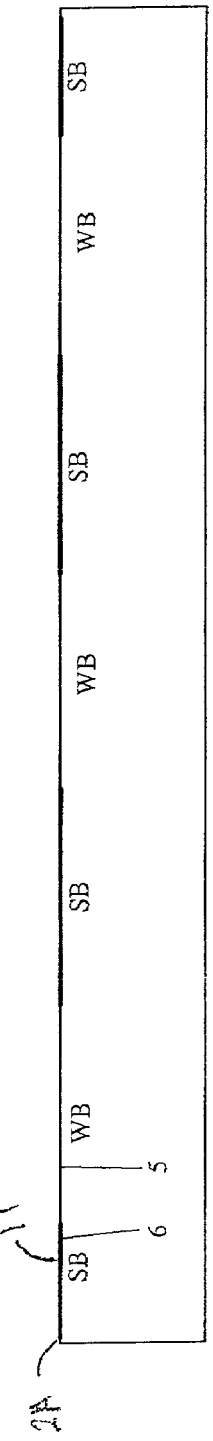

A further treatment technique may employ irradiation to attain strong bond regions 6 and/or weak bond regions 5. In this technique, layers 1 and/or 2 are irradiated with neutrons, ions, particle beams, or a combination thereof to achieve strong and/or weak bonding, as needed. For example, particles such as $He^+$, $H^+$, or other suitable ions or particles, electromagnetic energy, or laser beams may be irradiated at the strong bond regions 6 (at surfaces 1A (FIG. 10), 2A (FIG. 11), or both 1A and 2A). It should be understood that this method of irradiation differs from ion implantation for the purpose of delaminating a layer, generally in that the doses and/or implantation energies are much less (e.g., on the order of $\frac{1}{100}^{th}$ to $\frac{1}{1000}^{th}$ of the dosage used for delaminating).

Figure 2:
FIGS. 2–13 depict various treatment techniques for selective adhesion of the layers of the structure in FIG. 1.
Figure 3:
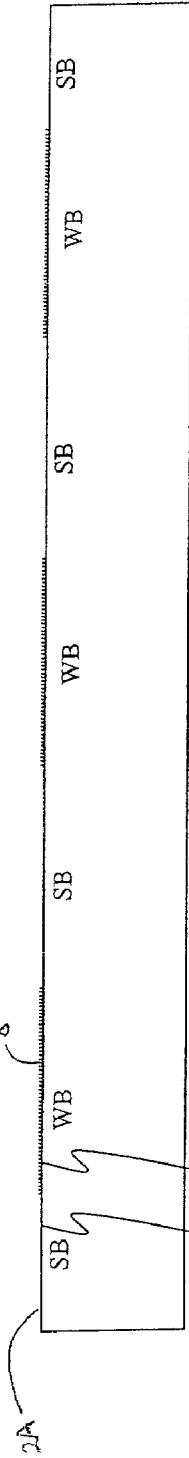

An additional treatment technique includes use of a of a slurry containing a solid component and a decomposable component on surface 1A, 2A, or both 1A and 2A. The solid component may be, for example, alumina, silicon oxide ($SiO(x)$), other solid metal or metal oxides, or other material that minimizes bonding of the layers 1 and 2. The decomposable component may be, for example, polyvinyl alcohol (PVA), or another suitable decomposable polymer. Generally, a slurry 8 is applied in weak bond region 5 at the surface 1A (FIG. 2), 2A (FIG. 3), or both 1A and 2A. Subsequently, layers 1 and/or 2 may be heated, preferably in an inert environment, to decompose the polymer. Accordingly, porous structures (comprised of the solid component of the slurry) remain at the weak bond regions 5, and upon bonding, layers 1 and 2 do not bond at the weak bond regions 5.

Figure 8:
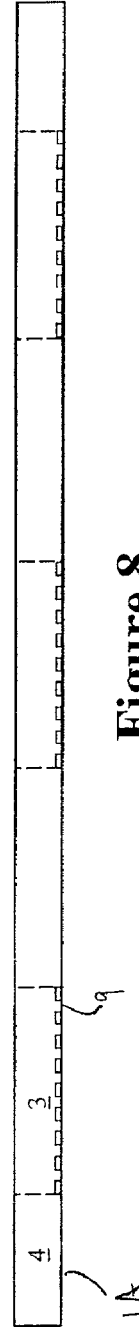
Figure 9:
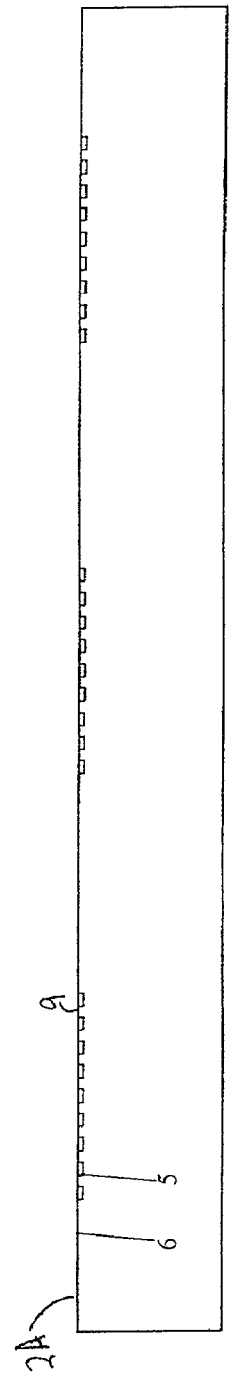

A still further treatment technique involves etching the surface of the weak bond regions 5. During this etching step, pillars 9 are defined in the weak bond regions 5 on surfaces 1A (FIG. 8), 2A (FIG. 9), or both 1A and 2A. The pillars may be defined by selective etching, leaving the pillars behind. The shape of the pillars may be triangular, pyramid shaped, rectangular, hemispherical, or other suitable shape. Alternatively, the pillars may be grown or deposited in the etched region. Since there are less bonding sites for the material to bond, the overall bond strength at the weak bond region 5 is much weaker then the bonding at the strong bond regions 6.

Figure 12:
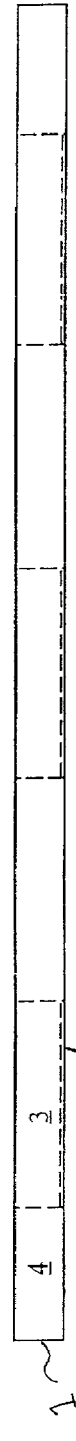
Figure 13:
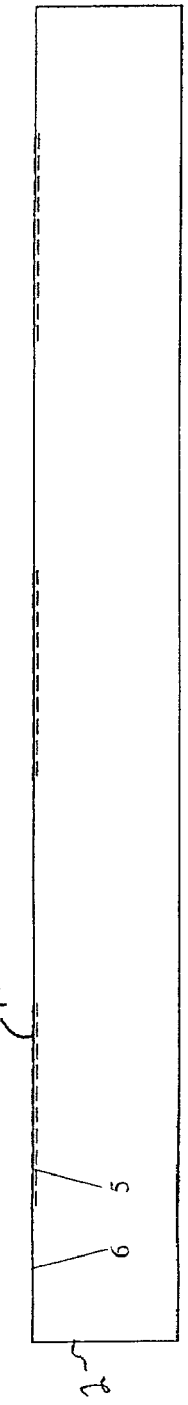

Yet another treatment technique involves inclusion of a void area 10 (FIGS. 12 and 13), e.g., formed by etching, machining, or both (depending on the materials used) at the weak bond regions 5 in layer 1 (FIG. 12), 2 (FIG. 13). Accordingly, when the first layer 1 is bonded to the second layer 2, the void areas 10 will minimize the bonding, as compared to the strong bond regions 6, which will facilitate subsequent debonding.

Another treatment technique involves use of one or more metal regions 8 at the weak bond regions 5 of surface 1A (FIG. 2), 2A (FIG. 3), or both 1A and 2A. For example, metals including but not limited to Cu, Au, Pt, or any combination or alloy thereof may be deposited on the weak bond regions 5. Upon bonding of layers 1 and 2, the weak bond regions 5 will be weakly bonded. The strong bond regions may remain untreated (wherein the bond strength difference provides the requisite strong bond to weak bond ratio with respect to weak bond layers 5 and strong bond regions 6), or may be treated as described above or below to promote strong adhesion.

A further treatment technique involves use of one or more adhesion promoters 11 at the strong bond regions 6 on surfaces 1A (FIG. 10), 2A (FIG. 11), or both 1A and 2A. Suitable adhesion promoters include, but are not limited to, TiO(x), tantalum oxide, or other adhesion promoter. Alternatively, adhesion promoter may be used on substantially all of the surface 1A and/or 2A, wherein a metal material is be placed between the adhesion promoter and the surface 1A or 2A (depending on the locale of the adhesion promoter) at the weak bond regions 5. Upon bonding, therefore, the metal material will prevent strong bonding a the weak bond regions 5, whereas the adhesion promoter remaining at the strong bond regions 6 promotes strong bonding.

Yet another treatment technique involves providing varying regions of hydriphobicity and/or hydrophillicity. For example, hydrophilic regions are particularly useful for strong bond regions 6, since materials such as silicon may bond spontaneously at room temperature. Hydrophobic and hydrophilic bonding techniques are known, both at room temperature and at elevated tempertures, for example, as described in Q. Y. Tong, U. Goesle, *Semiconductor Wafer Bonding, Science and Technology*, pp. 49–135, John Wiley and Sons, New York, N.Y. 1999, which is incorporated by reference herein.

A still further treatment technique involves one or more exfoliation layers that are selectively irradiated. For example, one or more exfoliation layers may be placed on the surface 1A and/or 2A. Without irradiation, the exfoliation layer behaves as an adhesive. Upon exposure to irradiation, such as ultraviolet irradiation, in the weak bond regions 5, the adhesive characteristics are minimized. The useful structures may be formed in or upon the weak bond regions 5, and a subsequent ultraviolet irradiation step, or other debonding technique, may be used to separate the layers 1 and 2 at the strong bond regions 6.

Figure 6:
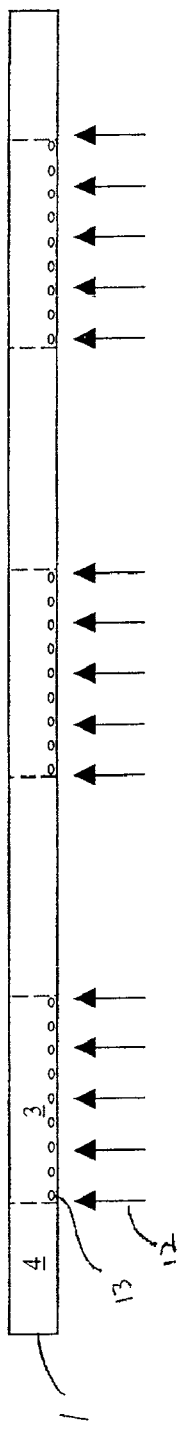
Figure 7:
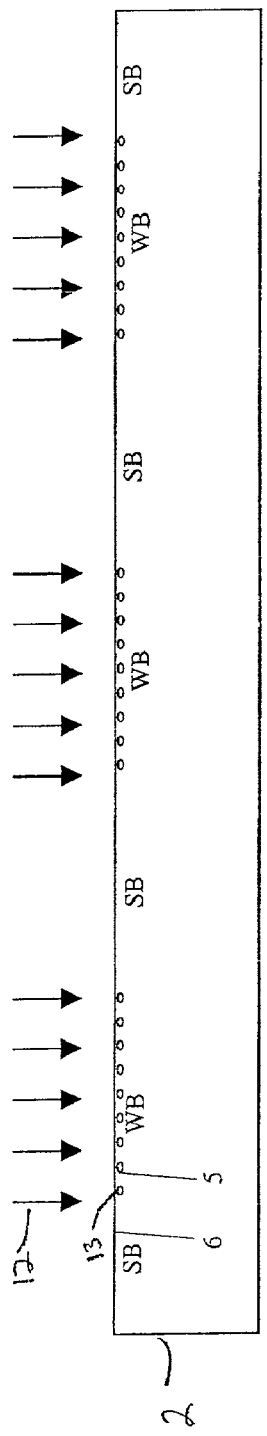

An additional treatment technique includes an implanting ions 12 (FIGS. 6 and 7) to allow formation of a plurality of microbubbles 13 in layer 1 (FIG. 6), layer 2 (FIG. 7), or both layers 1 and 2 in the weak regions 3, upon thermal treatment. Therefore, when layers 1 and 2 are bonded, the weak bond regions 5 will bond less than the strong bond regions 6, such that subsequent debonding of layers 1 and 2 at the weak bond regions 5 is facilitated.

Another treatment technique includes an ion implantation step followed by an etching step. In one embodiment, this technique is carried out with ion implantation through substantially all of the surface 1B. Subsequently, the weak bond regions 5 may be selectively etched. This method is described with reference to damage selective etching to remove defects in Simpson et al., "Implantation Induced Selective Chemical Etching of Indium Phosphide", Electrochemical and Solid-State Letters, 4(3) G26–G27, which is incorporated by reference herein.

A further treatment technique realizes one or more layers selectively positioned at weak bond regions 5 and/or strong bond regions 6 having radiation absorbing and/or reflective characteristics, which may be based on narrow or broad wavelength ranges. For example, one or more layers selectively positioned at strong bond regions 6 may have adhesive characteristics upon exposure to certain radiation wavelengths, such that the layer absorbs the radiation and bonds layers 1 and 2 at strong bond regions 6.

One of skill in the art will recognize that additional treatment technique may be employed, as well as combination comprising at least one of the foregoing treatment techniques. The key feature of any treatment employed, however, is the ability to form one or more region of weak bonding and one or more regions of strong bonding, providing SB/WB bond strength ratio greater than 1.

Figure 16:
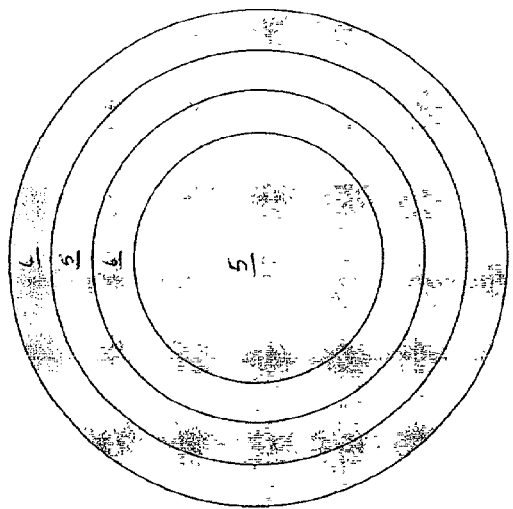
FIGS. 14–20 depict various bonding geometries for the structure of FIG. 1.
Figure 17:
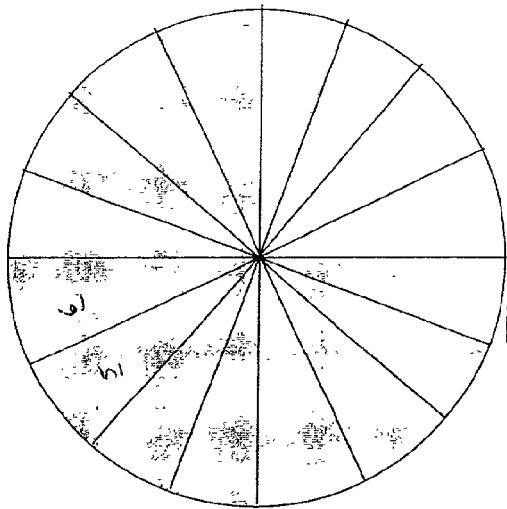
Figure 14:
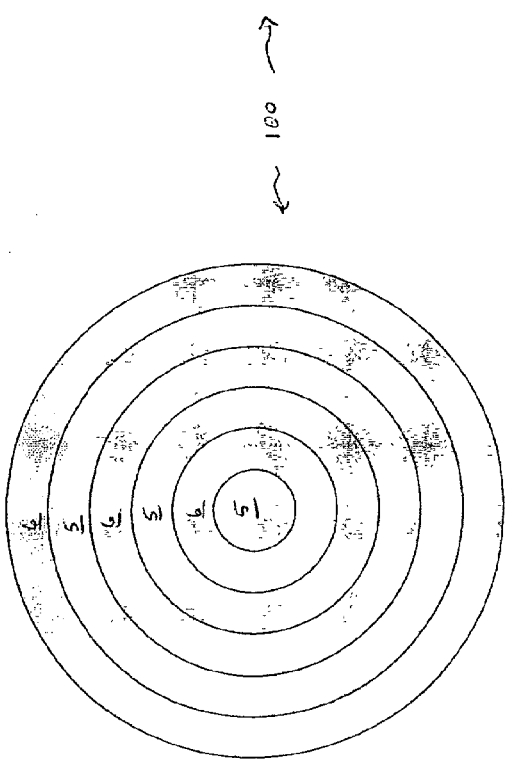
Figure 15:
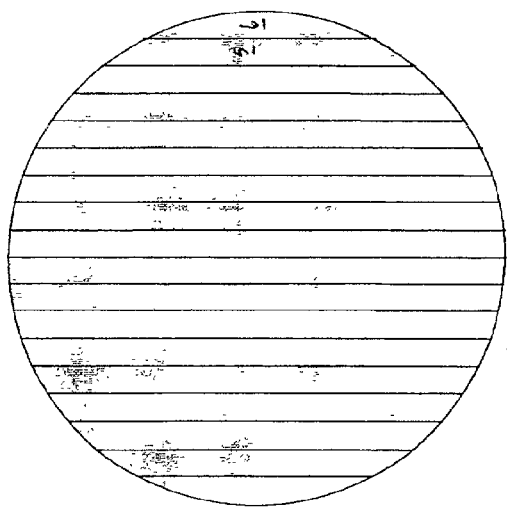
Figure 19:
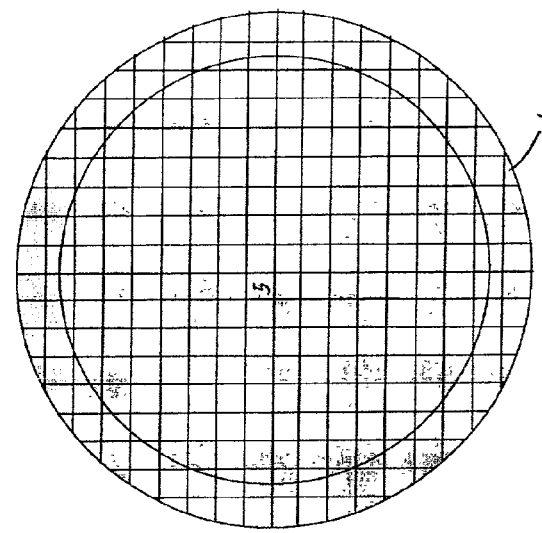
Figure 20:
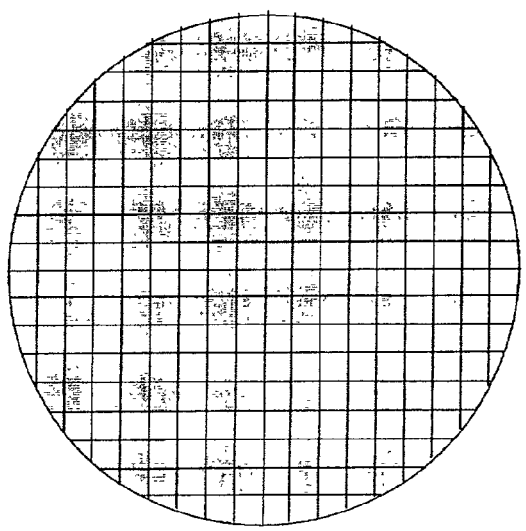
Figure 18:
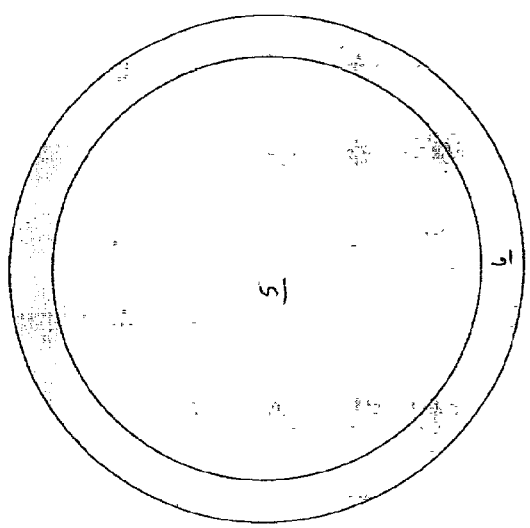

The geometry of the weak bond regions 5 and the strong bond regions 6 at the interface of layers 1 and 2 may vary depending on factors including, but not limited to, the type of useful structures formed on or in regions 3, the type of debonding/bonding selected, the treatment technique selected, and other factors. The regions 5, 6 may be concentric (FIGS. 14, 16 and 18), striped (FIG. 15), radiating (FIG. 17), checkered (FIG. 20), a combination of checkered and annular (FIG. 19), or any combination thereof. Of course, one of skill in the art will appreciate that any geometry may be selected. Furthermore, the ratio of the areas of weak bonding as compared to areas of strong bonding may vary. In general, the ratio provides sufficient bonding (i.e., at the strong bond regions 6) so as not to comprise the integrity of the multiple layer structure 100, especially during structure processing. Preferably, the ratio also maximizes useful regions (i.e., weak bond region 5) for structure processing.

After treatment of one or both of the surfaces 1A and 2A in substantially the locale of weak bond regions 5 and/or strong bond regions 6 as described above, layers 1 and 2 are bonded together to form a substantially integral multiple layer substrate 100. Layers 1 and 2 may be bonded together by one of a variety of techniques and/or physical phenomenon, including but not limited to, eutectic, fusion, anodic, vacuum, Van der Waals, chemical adhesion, hydrophobic phenomenon, hydrophilic phenomenon, hydrogen bonding, coulombic forces, capillary forces, very short-ranged forces, or a combination comprising at least one of the foregoing bonding techniques and/or physical phenomenon. Of course, it will be apparent to one of skill in the art that the bonding technique and/or physical phenomenon may depend in part on the one or more treatments techniques employed, the type or existence of useful structures formed thereon or therein, anticipated debonding method, or other factors.

Multiple layers substrate 100 thus may be provided to an end user. The end user may subsequently form one or more useful structures (not shown) in or upon regions 3, which substantially or partially overlap weak bond regions 5 at the interface of surfaces 1A and 2A. The useful structures may include one or more active or passive elements, devices, implements, tools, channels, other useful structures, or any combination comprising at least one of the foregoing useful structures. For instance, the useful structure may include an integrated circuit or a solar cell. Of course, one of skill in the art will appreciate that various microtechnology and nanotechnology based device may be formed.

After one or more structures have been formed on one or more selected regions 3 of layer 1, layer 1 may be debonded by a variety of methods. It will be appreciated that since the structures are formed in or upon the regions 4, which partially or substantially overlap weak bond regions 5, debonding of layer 1 can take place while minimizing or eliminating typical detriments to the structures associated with debonding, such as structural defects or deformations.

Debonding may be accomplished by a variety of known techniques. In general, debonding may depend, at least in part, on the treatment technique, bonding technique, materials, type or existence of useful structures, or other factors.

Referring in general to FIGS. 21–32, debonding techniques may based on implantation of ions or particles to form microbubbles at a reference depth, generally equivalent to thickness of the layer 1. The ions or particles may be derived from oxygen, hydrogen, helium, or other particles 14. The impanation may be followed by exposure to strong electromagnetic radiation, heat, light (e.g., infrared or ultraviolet), pressure, or a combination comprising at least one of the foregoing, to cause the particles or ions to form the microbubbles 15, and ultimately to expand and delaminate the layers 1 and 2. The implantation and optionally heat, light, and/or pressure may also be followed by a mechanical separation step (FIGS. 23, 26, 29, 32), for example, in a direction normal to the plane of the layers 1 and 2, parallel to the plane of the layers 1 and 2, at another angle with to the plane of the layers 1 and 2, in a peeling direction (indicated by broken lines in FIG. 23, 26, 29, 32), or a combination thereof. Ion implantation for separation of thin layers is described in further detail, for example, in Cheung, et al. U.S. Pat. No. 6,027,988 entitled "Method Of Separating Films From Bulk Substrates By Plasma Immersion Ion Implantation", which is incorporated by reference herein.

Figure 21:
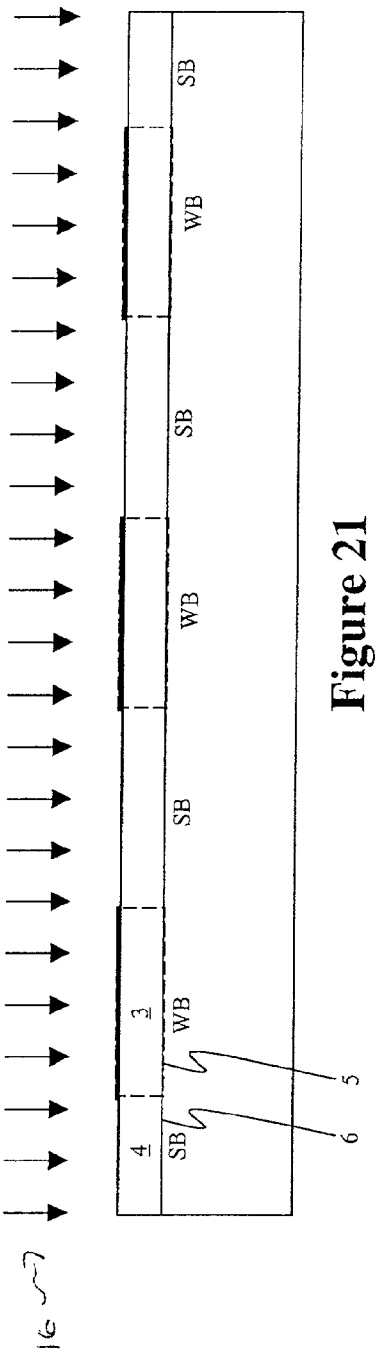
Figure 22:
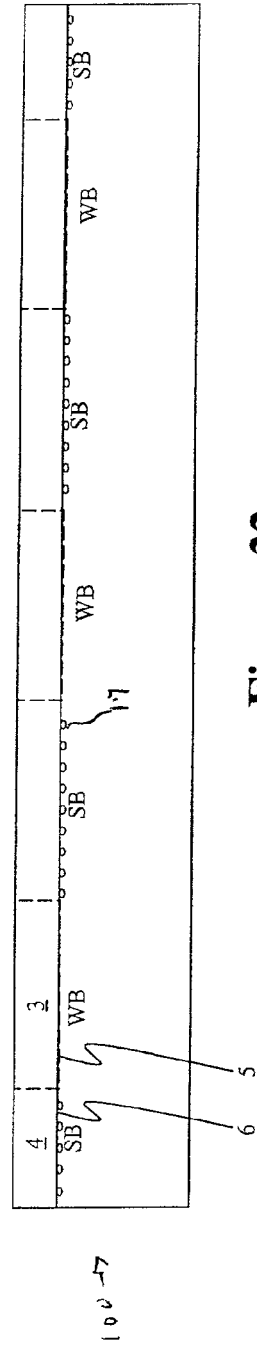
Figure 23:
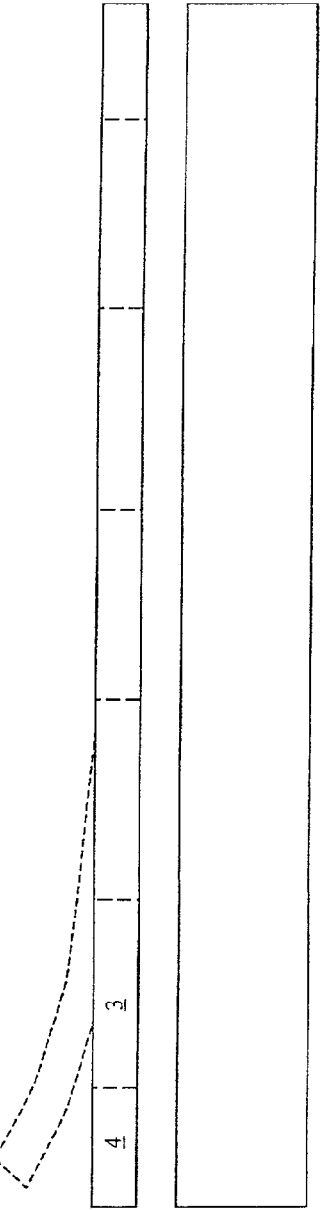
Figure 24:
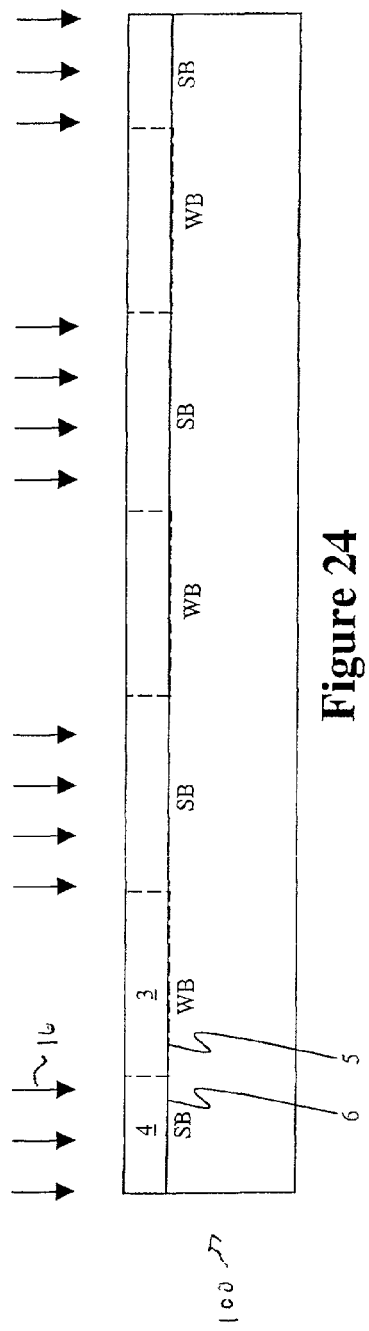
Figure 25:
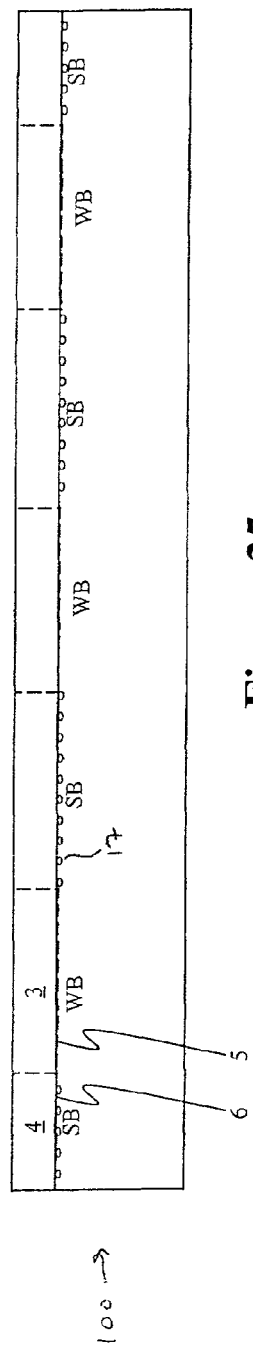
Figure 26:
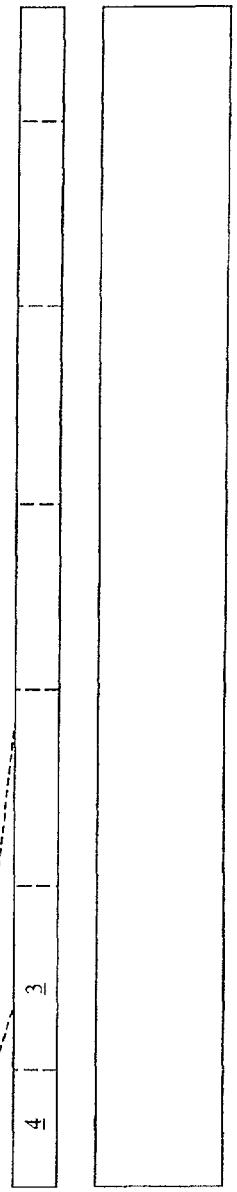
Figure 30:
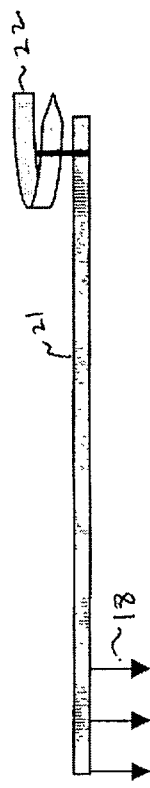
Figure 30:
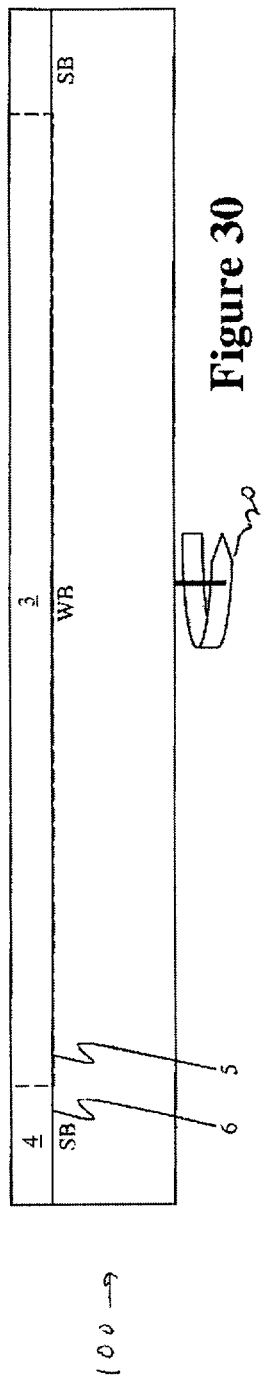
Figure 31:
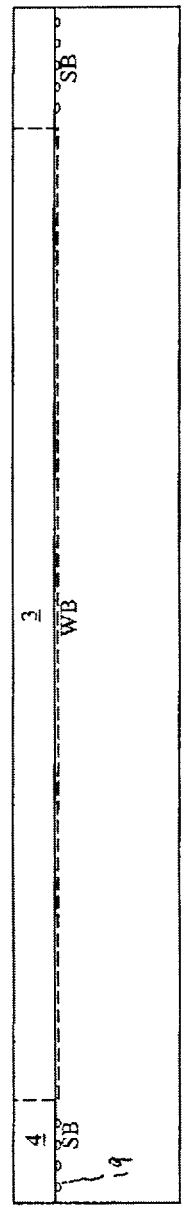
Figure 32:
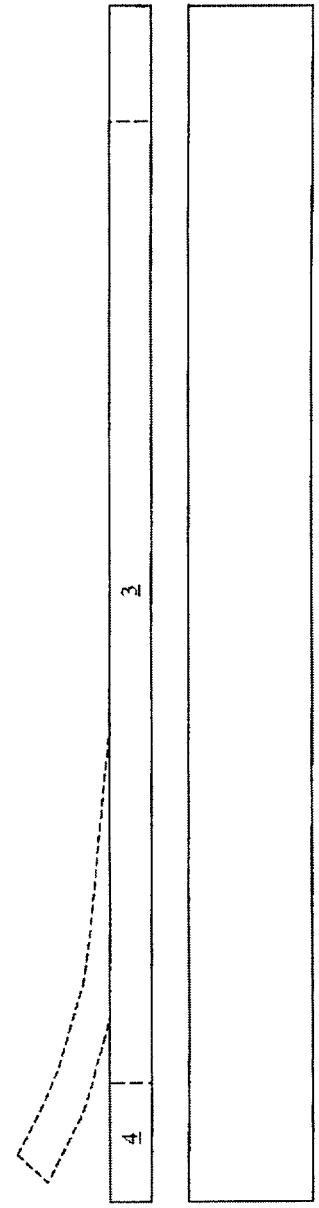

Referring particularly to FIGS. 21–23 and 24–26, the interface between layers 1 and 2 may be implanted selectively, particularly to form microbubbles 17 at the strong bond regions 6. In this manner, implantation of particles 16 at regions 3 (having one or more useful structures therein or thereon) is minimized, thus reducing the likelihood of repairable or irreparable damage that may occur to one or more useful structures in regions 3. Selective implantation may be carried out by selective ion beam scanning of the strong bond regions 4 (FIGS. 24–26) or masking of the regions 3 (FIGS. 21–23). Selective ion beam scanning refers to mechanical manipulation of the structure 100 and/or a device used to direct ions or particles to be implanted. As is known to those skilled in the art, various apparatus and techniques may be employed to carry out selective scanning, including but not limited to focused ion beam and electromagnetic beams. Further, various masking materials and technique are also well known in the art.

Referring to FIGS. 27–29, the implantation may be effectuated substantially across the entire surface 1B or 2B. Implantation is at suitable levels depending on the target and implanted materials and desired depth of implantation. Thus, where layer 2 is much thicker than layer 1, it may not be practical to implant through surface 2B; however, if layer 2 is a suitable implantation thickness (e.g., within feasible implantation energies), it may be desirable to implant through the surface 2B. This minimizes or eliminates possibility of repairable or irreparable damage that may occur to one or more useful structures in regions 3.

In one embodiment, and referring to FIGS. 18 and 30–32, strong bond regions 6 are formed at the outer periphery of the interface between layers 1 and 2. Accordingly, to debond layer 1 form layer 2, ions 18 may be implanted, for example, through region 4 to form microbubbles at the interface of layers 1 and 2. Preferably, selective scanning is used, wherein the structure 100 may be rotated (indicated by arrow 20), a scanning device 21 may be rotated (indicated by arrow 22), or a combination thereof. In this embodiment, a further advantage is the flexibility afforded the end user in selecting useful structures for formation therein or thereon. The dimensions of the strong bond region 6 (i.e., the width) are suitable to maintain mechanical and thermal integrity of the multiple layer substrate 100. Preferably, the dimension of the strong bond region 6 is minimized, thus maximizing the area of weak bond region 5 for structure processing. For example, strong bond region 6 may be about one (1) micron of an eight (8) inch water.

Further, debonding of layer 1 from layer 2 may be initiated by other conventional methods, such as etching (parallel to surface), for example, to form an etch through strong bond regions 6. In such embodiments, the treatment technique is particularly compatible, for example wherein the strong bond region 6 is treated with an oxide layer that has a much higher etch selectivity that the bulk material (i.e., layers 1 and 2). The weak bond regions 5 preferably do not require etching to debond layer 1 from layer 2 at the locale of weak bond regions 5, since the selected treatment, or lack thereof, prevented bonding in the step of bonding layer 1 to layer 2.

Alternatively, cleavage propagation may be used to initiate debonding of layer 1 from layer 2. Again, the debonding preferably is only required at the locale of the strong bond regions 6, since the bond at the weak bond regions 5 is limited. Further, debonding may be initiated by etching (normal to surface), as is conventionally known, preferably limited to the locales of regions 4 (i.e., partially or substantially overlapping the strong bond regions 6).

Layers 1 and 2 may be the same or different materials, and may include materials including, but not limited to, plastic (e.g., polycarbonate), metal, semiconductor, insulator, monocrystalline, amorphous, noncrystalline, biological (e.g., DNA based films) or a combination comprising at least one of the foregoing types of materials. For example, specific types of materials include silicon (e.g., monocrystalline, polycrystalline, noncrystalline, polysilicon, and derivatives such as $Si_3N_4$, SiC, $SiO_2$), GaAs, InP, CdSe, CdTe, SiGe, GaAsP, GaN, SiC, GaAlAs, InAs, AlGaSb, InGaAs, ZnS, AlN, TiN, other group IIIA–VA materials, group IIB materials, group VIA materials, sapphire, quartz (crystal or glass), diamond, silica and/or silicate based material, or any combination comprising at least one of the foregoing materials. Of course, processing of other types of materials may benefit from the process described herein to provide multiple layer substrates 100 of desired composition. Preferred materials which are particularly suitable for the herein described methods include semiconductor material (e.g., silicon) as layer 1, and semiconductor material (e.g., silicon) as layer 2, other combinations include, but are not limited to; semiconductor (layer 1) or glass (layer 2); semiconductor (layer 1) on silicon carbide (layer 2) semiconductor (layer 1) on sapphire (layer 2); GaN (layer 1) on sapphire (layer 2); GaN (layer 1) on glass A0 (layer 2); GaN (layer 1) on silicon carbide (layer 2);plastic (layer 1) on plastic (layer 2), wherein layers 1 and 2 may be the same or different plastics; and plastic (layer 1) on glass (layer 2).

Layers 1 and 2 may be derived from various sources, including wafers or fluid material deposited to form films and/or substrate structures. Where the starting material is in the form of a wafer, any conventional process may be used to derive layers 1 and/or 2. For example, layer 2 may consist of a wafer, and layer 1 may comprise a portion of the same or different wafer. The portion of the wafer constituting layer 1 may be derived from mechanical thinning (e.g., mechanical grinding, cutting, polishing; chemical-mechanical polishing; polish-stop; or combinations including at least one of the foregoing), cleavage propagation, ion implantation followed by mechanical separation (e.g., cleavage propagation, normal to the plane of structure 100, parallel to the plane of structure 100, in a peeling direction, or a combination thereof), ion implantation followed by heat, light, and/or pressure induced layer splitting), chemical etching, or the like. Further, either or both layers 1 and 2 may be deposited or grown, for example by chemical vapor deposition, epitaxial growth methods, or the like.

An important benefit of the instant method and resulting multiple layer substrate, or thin film derived from the multiple layer substrate is that the structures are formed in or upon the regions 3, which partially or substantially overlap the weak bond regions 5. This substantially minimizes or eliminates likelihood of damage to the useful structures when the layer 1 is removed from layer 2. The debonding step generally requires intrusion (e.g., with ion implantation), force application, or other techniques required to debond layers 1 and 2. Since, in certain embodiments, the structures are in or upon regions 3 that do not need local intrusion, force application, or other process steps that may damage, reparably or irreparable, the structures, the layer 1 may be removed, and structures derived therefrom, without subsequent processing to repair the structures. The regions 4 partially or substantially overlapping the strong bond regions 6 do generally not have structures thereon, therefore these regions 4 may be subjected to intrusion or force without damage to the structures.

The layer 1 may be removed as a self supported film or a supported film. For example, handles are commonly employed for attachment to layer 1 such that layer 1 may be removed from layer 2, and remain supported by the handle. Generally, the handle may be used to subsequently place the film or a portion thereof (e.g., having one or more useful structures) on an intended substrate, another processed film, or alternatively remain on the handle.

One benefit of the instant method is that the material constituting layer 2 is may be reused and recycled. A single wafer may be used, for example, to derive layer 1 by any known method. The derived layer 1 may be selectively bonded to the remaining portion (layer 2) as described above. When the thin film is debonded, the process is repeated, using the remaining portion of layer 2 to obtain a thin film to be used as the next layer 1. This may be repeated until it no longer becomes feasible or practical to use the remaining portion of layer 2 to derive a thin film for layer 1.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A structure comprising:
a first layer selectively bonded to a second layer, wherein selective bonding includes at least one region of strong bonding and at least one region of weak bonding at the interface of the first layer and the second layer, wherein the first layer at the region of weak bonding contains a useful device therein or thereon, said useful device not being present at the one or more regions of strong bonding, and further wherein a bond strength ratio of a bond strength at the region of strong bonding to a bond strength at the region of weak bonding is greater than 1.

2. The structure as in claim 1, wherein the first layer and the second layer are in condition for separation by debonding primarily or entirely in the region of strong bonding, minimizing detriment to the useful device to be formed.

3. The structure as in claim 2, wherein regions of weak bonding are in condition for separating by a lesser degree of debonding than is required for the regions of strong bonding.

4. The structure as in claim 1, wherein the first layer is selected from the group of materials consisting of plastic, metal, semiconductor, insulator, monocrystalline, amorphous, noncrystalline, biological, or a combination comprising at least one of the foregoing materials.

5. The structure as in claim 1, wherein the first layer is selected from the group of materials consisting of monocrystalline silicon, polycrystalline silicon, noncrystalline silicon, polysilicon, $Si_3N_4$, SiC, $SiO_2$, GaAs, GaN, InP, CdSe, CdTe, SiGe, GaAsP, GaAlAs, InAs, AlGaSb, InGaAs, ZnS, AlN, TiN, sapphire, crystal quartz, glass quartz, diamond, silica, silicate based material, or a combination comprising at least one of the foregoing materials.

6. The structure as in claim 1, wherein the second layer is selected from the group of materials consisting of plastic, metal, semiconductor, insulator, monocrystalline, amorphous, noncrystalline, biological, or a combination comprising at least one of the foregoing materials.

7. The structure as in claim 1, wherein the second layer is selected from the group of materials consisting of monocrystalline silicon, polycrystalline silicon, noncrystalline silicon, polysilicon, $Si_3N_4$, SiC, $SiO_2$, GaAs, GaN, InP, CdSe, CdTe, SiGe, GaAsP, GaAlAs, InAs, AlGaSb, InGaAs, ZnS, AlN, TiN, sapphire, crystal quartz, glass quartz, diamond, silica, silicate based material, or a combination comprising at least one of the foregoing materials.

8. The structure as in claim 1, wherein the first layer comprises semiconductor.

9. The structure as in claim 1, wherein the first layer comprises silicon and the second layer comprises silicon.

10. The structure as in claim 1, wherein the first layer comprises silicon and the second layer comprises glass.

11. The structure as in claim 1, wherein the first layer comprises silicon and the second layer comprises quartz.

12. The structure as in claim 1, wherein the bond strength ratio of the bond strength at the region of strong bonding to the bond strength at the region of weak bonding is greater than about 2.

13. The structure as in claim 1, wherein the bond strength ratio of the bond strength at the region of strong bonding to the bond strength at the region of weak bonding is greater than about 5.

14. The structure as in claim 1, wherein the bond strength ratio of the bond strength at the region of strong bonding to the bond strength at the region of weak bonding is greater than about 10.

15. The structure as in claim 1, wherein the first layer is selectively bonded to the second layer at a periphery of an interface between the first layer and the second layer.

16. A semiconductor device comprising
   a first semiconductor substrate selectively bonded to a second support substrate, including at least one region of strong bonding and at least one region of weak bonding at the interface of the first layer and the second layer, and
   a useful structure in or upon the first layer at the at least one region of weak bonding, said useful structure not being present in one or more regions of strong bonding.

17. The semiconductor device as in claim 16, wherein the first semiconductor substrate having the useful structure therein or thereupon is removed from the second support substrate.

18. A structure comprising:
   a first layer selectively bonded to a second layer, including at least one region of strong bonding and at least one region of weak bonding at the interface of the first layer and the second layer, wherein the first layer at the region of weak bonding contains a useful device therein or thereon, said useful device not being present in said one or more regions of strong bending.

* * * * *